(12) United States Patent
Chang et al.

(10) Patent No.: US 12,733,214 B2
(45) Date of Patent: Sep. 8, 2026

(54) SURFACE-DOPED CHANNELS FOR THRESHOLD VOLTAGE MODULATION

(71) Applicant: Taiwan Semiconductor Manufacturing Company, Ltd., Hsinchu (TW)

(72) Inventors: Hsiao-Chun Chang, Hsinchu (TW); Guan-Jie Shen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 941 days.

(21) Appl. No.: 17/527,975

(22) Filed: Nov. 16, 2021

(65) Prior Publication Data

US 2022/0359768 A1 Nov. 10, 2022

Related U.S. Application Data

(60) Provisional application No. 63/185,741, filed on May 7, 2021.

(51) Int. Cl.

| | |
|---|---|
| ***H10D 30/67*** | (2025.01) |
| ***H10D 30/01*** | (2025.01) |
| ***H10D 30/62*** | (2025.01) |
| ***H10D 62/10*** | (2025.01) |
| ***H10D 62/17*** | (2025.01) |
| ***H10D 62/815*** | (2025.01) |

(52) U.S. Cl.

CPC ....... *H10D 30/6757* (2025.01); *H10D 30/031* (2025.01); *H10D 30/6735* (2025.01); *H10D 62/121* (2025.01); *H10D 62/292* (2025.01); *H10D 62/307* (2025.01); *H10D 62/8171* (2025.01); *H10D 30/014* (2025.01); *H10D 30/024* (2025.01); *H10D 30/6211* (2025.01)

(58) Field of Classification Search

CPC ..... H01L 21/8232–823412; H01L 29/15–157; H01L 29/0673; H01L 29/66795; H01L 29/78696; H01L 21/823807; H10D 30/67–6757; H10D 30/6721; H10D 30/014; H10D 30/024; H10D 30/43; H10D 84/0128; H10D 84/0167; H10D 84/83; H10D 62/307; H10D 62/8171; H10D 62/60

See application file for complete search history.

(56) References Cited

U.S. PATENT DOCUMENTS 9,093,530 B2 7/2015 Huang et al.
9,171,929 B2 10/2015 Lee et al.
9,214,555 B2 12/2015 Oxland et al.

(Continued)

*Primary Examiner* — Chad M Dicke
*Assistant Examiner* — Mario Andres Autore, Jr.
(74) *Attorney, Agent, or Firm* — Sterne, Kessler, Goldstein & Fox P.L.L.C.

(57) ABSTRACT

GAAFET threshold voltages are tuned by introducing dopants into a channel region. In a GAAFET that has a stacked channel structure, dopants can be introduced into multiple channels by first doping nano-structured layers adjacent to the channels. Then, by an anneal operation, dopants can be driven, from surfaces of the doped layers into the channels, to achieve a graduated dopant concentration profile. Following the anneal operation and after the dopants are diffused into the channels, depleted doped layers can be replaced with a gate structure to provide radial control of current in the surface-doped channels.

20 Claims, 13 Drawing Sheets

(56) References Cited

U.S. PATENT DOCUMENTS 9,236,267 B2 1/2016 De et al.
9,520,482 B1 12/2016 Chang et al.
9,548,303 B2 1/2017 Lee et al.
9,564,489 B2 2/2017 Yeo et al.
9,576,814 B2 2/2017 Wu et al.
9,601,342 B2 3/2017 Lee et al.
9,608,116 B2 3/2017 Ching et al.
10,177,227 B1 * 1/2019 Yoshida ............ H01L 21/67742
10,367,061 B1 * 7/2019 Loubet ................... H10D 86/60
11,075,273 B1 * 7/2021 Reznicek ........... H10D 30/6735
2007/0232039 A1 * 10/2007 Kubo ................... H10D 84/038 257/E21.633
2011/0031473 A1 * 2/2011 Chang .................. H10D 86/201 257/E27.098
2014/0217502 A1 * 8/2014 Chang ...................... H10D 8/00 438/151
2014/0264595 A1 * 9/2014 Basker ................. H10D 30/024 257/347
2015/0028454 A1 * 1/2015 Cheng ................ H10D 84/0193 438/478
2015/0340291 A1 * 11/2015 Cheng ................ H10D 84/0167 257/401
2017/0092371 A1 * 3/2017 Harari .................. H10D 30/693
2017/0179251 A1 * 6/2017 Balakrishnan .... H01L 21/02433
2017/0194216 A1 * 7/2017 Doris ................... H10D 62/832
2018/0151448 A1 * 5/2018 Wang ................... H10D 86/201
2019/0109192 A1 * 4/2019 Angot ................. H01L 21/2254
2019/0198614 A1 * 6/2019 Reboh .................. H10D 62/021
2019/0305106 A1 * 10/2019 Bi ...................... H10D 30/6212
2020/0006559 A1 * 1/2020 Mehandru .............. H10D 84/83
2020/0105893 A1 * 4/2020 Xiao .................... H10D 86/201
2020/0211901 A1 * 7/2020 Clendenning ...... H10D 84/0128
2020/0357931 A1 * 11/2020 Lee ...................... H10D 30/014
2021/0134721 A1 * 5/2021 Chiang .............. H10D 30/6713
2021/0234047 A1 * 7/2021 Tsai .................... H01L 29/0653
2022/0181499 A1 * 6/2022 Jung .................... H10D 30/031

* cited by examiner h
102

120a
155
121
122
102
z
y
x 120a
120b
155
121
122
h
103
151
102
151
z
y
x 128
107
121
122
121
122
121
z
x
y

| | NFET | PFET | NFET | PFET | NFET | PFET | NFET | PFET |
|---|---|---|---|---|---|---|---|---|
| S/D | Si:P | Si:B | SiGe:P | SiGe:B | Si:P | Si:B | SiGe:P | SiGe:B |
| Channel | Si:P | Si:B | SiGe:P | SiGe:B | Si:B | Si:P | SiGe:B | SiGe:P |
| | doped | | | | anti-doped | | | |

Fig. 10

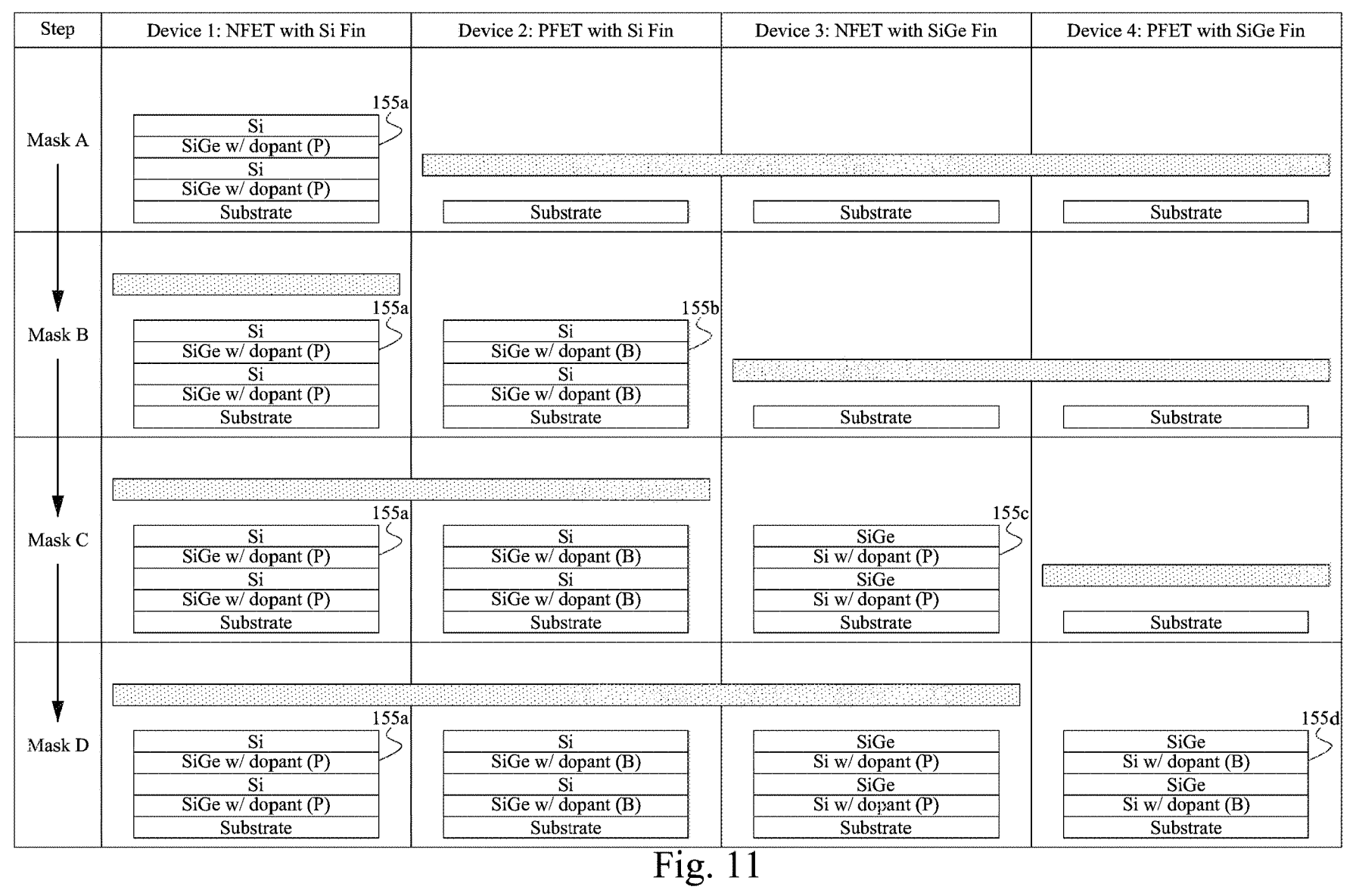

| Step | Device 1: NFET with Si Fin | Device 2: PFET with Si Fin | Device 3: NFET with SiGe Fin | Device 4: PFET with SiGe Fin |
| --- | --- | --- | --- | --- |
| Mask A | 155a<br>Si<br>SiGe w/ dopant (P)<br>Si<br>SiGe w/ dopant (P)<br>Substrate | Substrate | Substrate | Substrate |
| Mask B | 155a<br>Si<br>SiGe w/ dopant (P)<br>Si<br>SiGe w/ dopant (P)<br>Substrate | 155b<br>Si<br>SiGe w/ dopant (B)<br>Si<br>SiGe w/ dopant (B)<br>Substrate | Substrate | Substrate |
| Mask C | 155a<br>Si<br>SiGe w/ dopant (P)<br>Si<br>SiGe w/ dopant (P)<br>Substrate | Si<br>SiGe w/ dopant (B)<br>Si<br>SiGe w/ dopant (B)<br>Substrate | 155c<br>SiGe<br>Si w/ dopant (P)<br>SiGe<br>Si w/ dopant (P)<br>Substrate | Substrate |
| Mask D | 155a<br>Si<br>SiGe w/ dopant (P)<br>Si<br>SiGe w/ dopant (P)<br>Substrate | Si<br>SiGe w/ dopant (B)<br>Si<br>SiGe w/ dopant (B)<br>Substrate | SiGe<br>Si w/ dopant (P)<br>SiGe<br>Si w/ dopant (P)<br>Substrate | 155d<br>SiGe<br>Si w/ dopant (B)<br>SiGe<br>Si w/ dopant (B)<br>Substrate |

Fig. 11

SURFACE-DOPED CHANNELS FOR THRESHOLD VOLTAGE MODULATION

CROSS-REFERENCE TO RELATED APPLICATION

This patent application claims benefit of U.S. Provisional Patent Application No. 63/185,741 filed on May 7, 2021 and titled "The Novel Surface-Doped Gate-All-Around Structure for $V_t$ Modulation," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIGS. 4A-5B are cross-sectional views illustrating process operations for forming superlattice structures, in accordance with some embodiments.

FIGS. 6A-9C are isometric and cross-sectional views of GAAFETs at various stages of their fabrication process, in accordance with some embodiments.

FIG. 10 is a chart showing eight different combinations of doped and anti-doped channel GAAFETs, in accordance with some embodiments.

FIGS. 11 and 12 are charts showing masking sequences for fabricating different types of channel-doped and anti-doped GAAFETs on a common substrate, in accordance with some embodiments.

DETAILED DESCRIPTION

Figure 1:
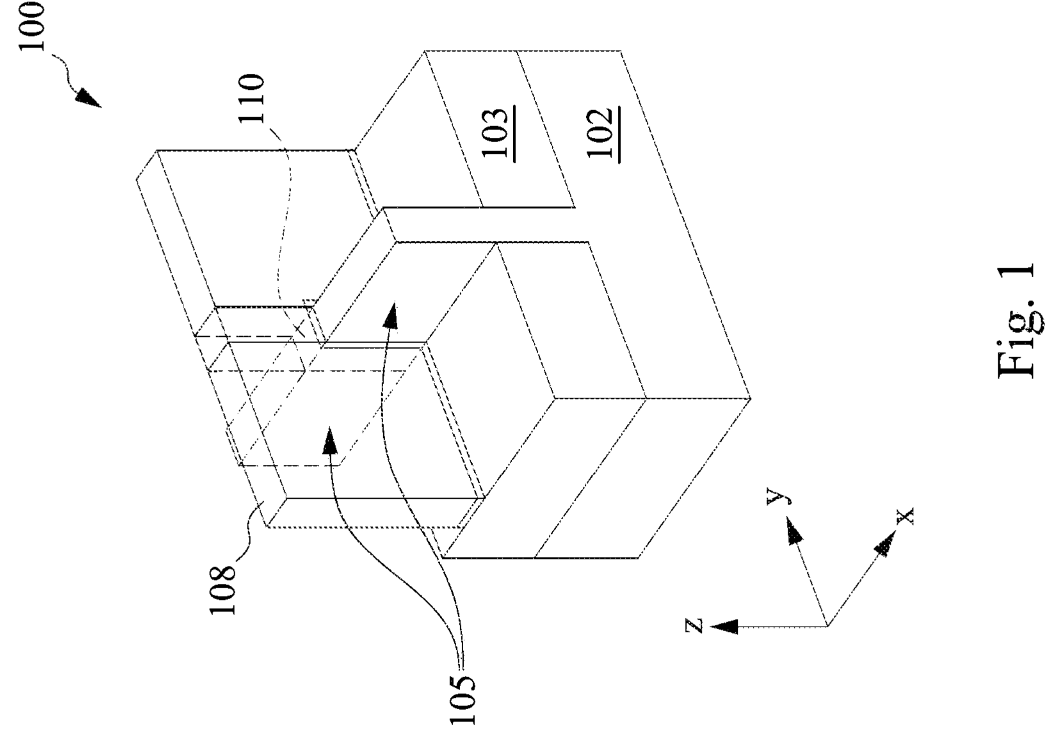
FIG. 1 is an isometric view of a FinFET, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

Structures disclosed herein may be patterned by various methods. For example, fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The threshold voltage, $v_t$, of a transistor is an important device characteristic, since it determines whether the transistor is in the on-state or the off-state. Therefore, it is desirable to control the threshold voltage in accordance with the transistor design, e.g., by specifying device dimensions and materials. One way that has been used to modulate, or tune, the threshold voltage is by altering materials used in the transistor gate. For example, various layers in a metal stack used to form a metal gate, such as one or more work function metals, can be modified in different ways to adjust $v_t$. Another approach for tuning the threshold voltage, as disclosed herein, is to introduce dopants into the channel region. In a GAAFET that has a stacked channel structure, dopants can be introduced into the multiple channels by first doping nano-structured layers adjacent to the channels. Then, by annealing the partially-fabricated structure, dopants can be driven from surfaces of the doped layers into the channels, to achieve a graduated dopant concentration profile. Following the drive-in anneal and after the dopants are diffused into the channels, the depleted doped layers can be replaced with a gate-all-around structure to provide radial control of current in the surface-doped channels.

Although the present disclosure is directed to GAAFETs, it is beneficial to begin a discussion of GAAFETs by first considering the structure of a FinFET. FIG. 1 is an isometric view of a FinFET 100, with transparency, in accordance with some embodiments. FinFET 100 includes a substrate 102, shallow trench isolation (STI) regions 103, a fin having source and drain regions 104 and 106, respectively (each also referred to as "source/drain region 105"), a gate structure 108, and a channel 110. FinFET 100 is formed on substrate 102. STI regions 103 are formed in substrate 102 to electrically isolate neighboring FinFETs from one another. FinFET 100 preceded the GAAFET as a non-planar (3D) transistor design, in which channel 110 is disposed above the surface of substrate 102, thus allowing gate 108 to wrap around channel 110 and influence current in the channel from multiple directions. In this 3-D design, a fin including source/drain regions 105 is formed from a portion of substrate 102, extending outward from an upper surface of substrate 102 in the z-direction.

Source/drain region 105 is doped with either a positive or a negative species to provide charge reservoirs for FinFET 100. For example, for a negative FET (NFET), source/drain region 105 can include the substrate material, such as Si, and n-type dopants. For a positive FET (PFET), source/drain region 105 can include the substrate material, such as Si and SiGe, and p-type dopants. In some embodiments, the term "p-type" defines a structure, layer, and/or region as being doped with, for example, boron (B), indium (In), or gallium (Ga). In some embodiments, the term "n-type" defines a structure, layer, and/or region as being doped with, for example, phosphorus (P) or arsenic (As). An NFET device may be disposed in a p-type region of substrate 102, or a p-well. A PFET device may be disposed in an n-type region of substrate 102, or an n-well.

During operation of FinFET 100, current flows from the source region to the drain region, through channel 110, in response to a voltage applied to gate structure 108. Gate structure 108 surrounds three sides of the fin, so as to control the current flow through channel 110. When the voltage applied to gate structure 108 exceeds a certain threshold voltage, FinFET 100 switches on and current flows through channel 110. If the applied voltage drops below the threshold voltage, FinFET 100 shuts off, and current ceases to flow through channel 110. Because the wrap-around arrangement of gate structure 108 influences channel 110 from three sides, improved control of the conduction properties of channel 110 is achieved in FinFET 100, compared with planar FETs.

Gate structure 108 can be a multi-layered structure that includes (not shown) a gate electrode, a gate dielectric that separates the gate electrode from the fin, and sidewall spacers, as described in greater detail below. A single FinFET is shown in FIG. 1. However, gate structure 108 may wrap around multiple fins arranged along the y-direction to form multiple FinFETs. Likewise, separated regions of a single fin may be controlled by multiple gates arranged, along the x-direction, to form multiple FinFETs.

Figures 2A, 2B, 2C, 2D:
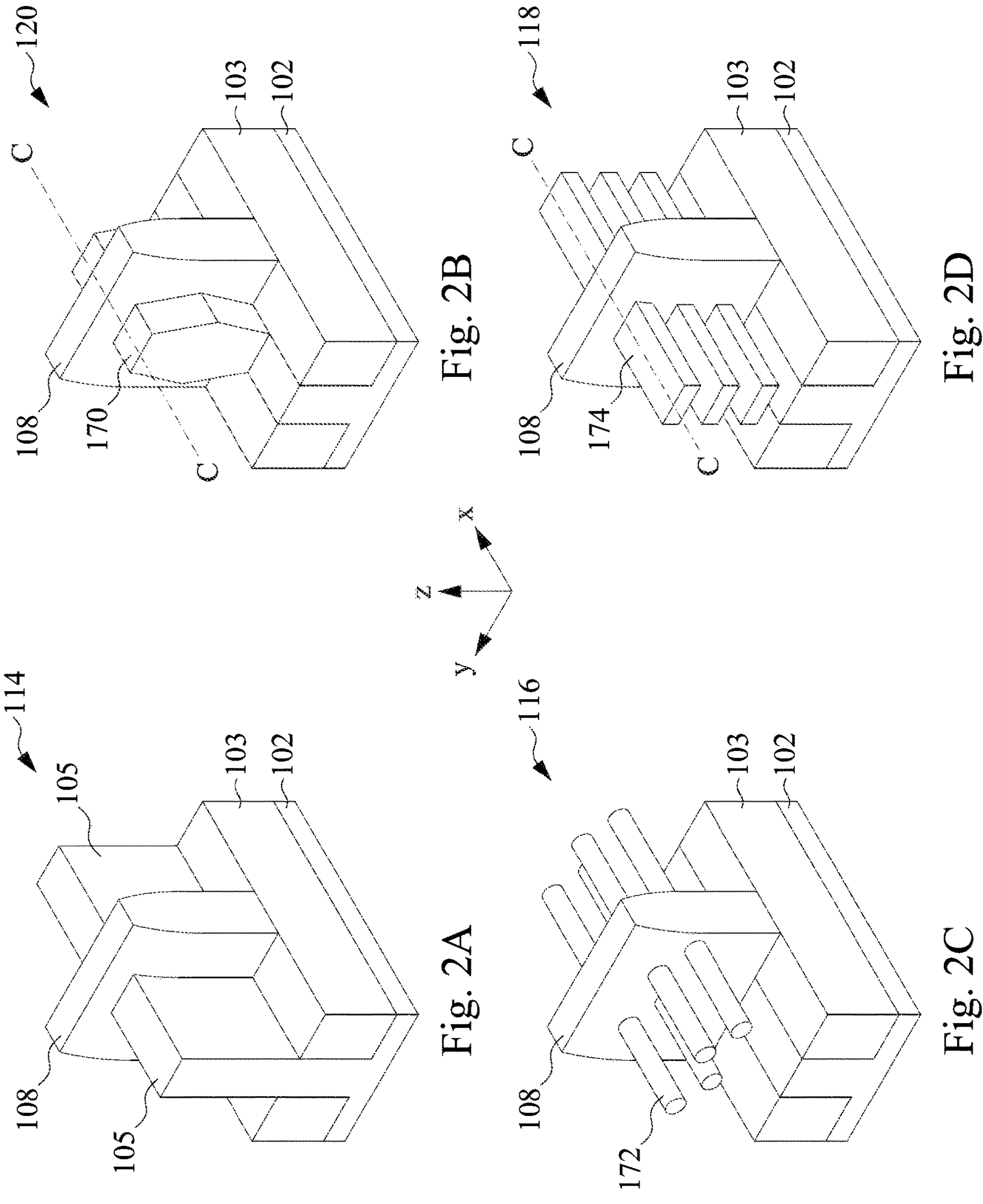
FIGS. 2A-2D are isometric views of FinFETs and gate-all-around field effect transistors (GAAFETs), in accordance with some embodiments.

A FinFET in which channel 110 takes the form of a multi-channel stack is known as a gate-all-around (GAA) FET. In a GAAFET, the multiple channels within the stack are surrounded by the gate on all four sides, instead of three sides, so as to further improve control of current flow in channels 110. FIGS. 2A-2D illustrate different types of FinFET and GAAFET structures, in accordance with some embodiments. FIG. 2A shows an isometric view of FinFET 100 of FIG. 1, rotated by 90 degrees. FIGS. 2B-2D show similar isometric views of GAAFETs that are variations on the design of FinFET 100. GAAFETs having 1-D, linear channels, or nano-wires 172 are known as nano-wire FETs 116 (FIG. 2C); GAAFETs having 2-D channels, or nano-sheets 174, are known as nano-sheet FETs 118 (FIG. 2D). GAAFETs in which the fins have been recessed in the source/drain regions and replaced by epitaxial source/drain regions 170 are known as epi source/drain GAAFETs 120 (FIG. 2B).

Embodiments of the present disclosure are shown and described, by way of example, as GAAFETs 120 (e.g., as shown in FIGS. 2B and 2D) having certain features. However, such features described herein may be applied to other types of FETs having nano-structured channel regions, such as stacked channel nano-wire FETs (e.g., as shown in FIG. 2C). Structures, such as those shown in FIGS. 2A-2D, may be formed on a common substrate 102, or on different substrates.

Figure 3:
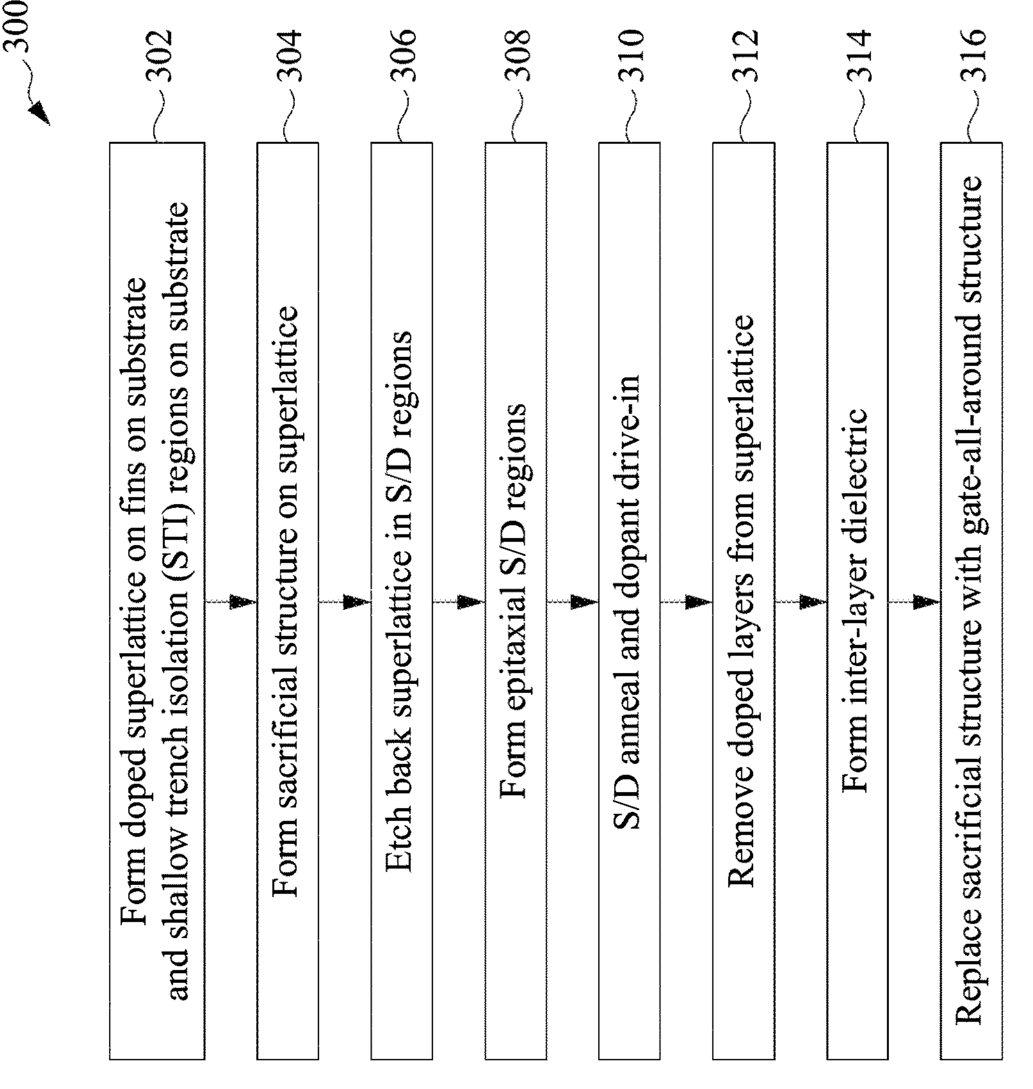
FIG. 3 is a flow diagram of a method for fabricating surface-doped GAAFETs, in accordance with some embodiments.

FIG. 3 is a flow diagram of a method 300 for fabricating the exemplary GAAFET 120 of FIG. 2B, according to some embodiments. For illustrative purposes, operations illustrated in FIG. 3 will be described with reference to the exemplary process for fabricating GAAFET 120, as illustrated in FIGS. 4A-6C and 8A-9C, which are isometric and cross-sectional views of GAAFET 120 at various stages of its fabrication, according to some embodiments.

Operations of method 300 can be performed in a different order, or not performed, depending on specific applications. It is noted that method 300 may not produce a complete semiconductor device. Accordingly, it is understood that additional processes can be provided before, during, or after method 300, and that some of these additional processes may only be briefly described herein.

Figures 4A, 4B, 4C:
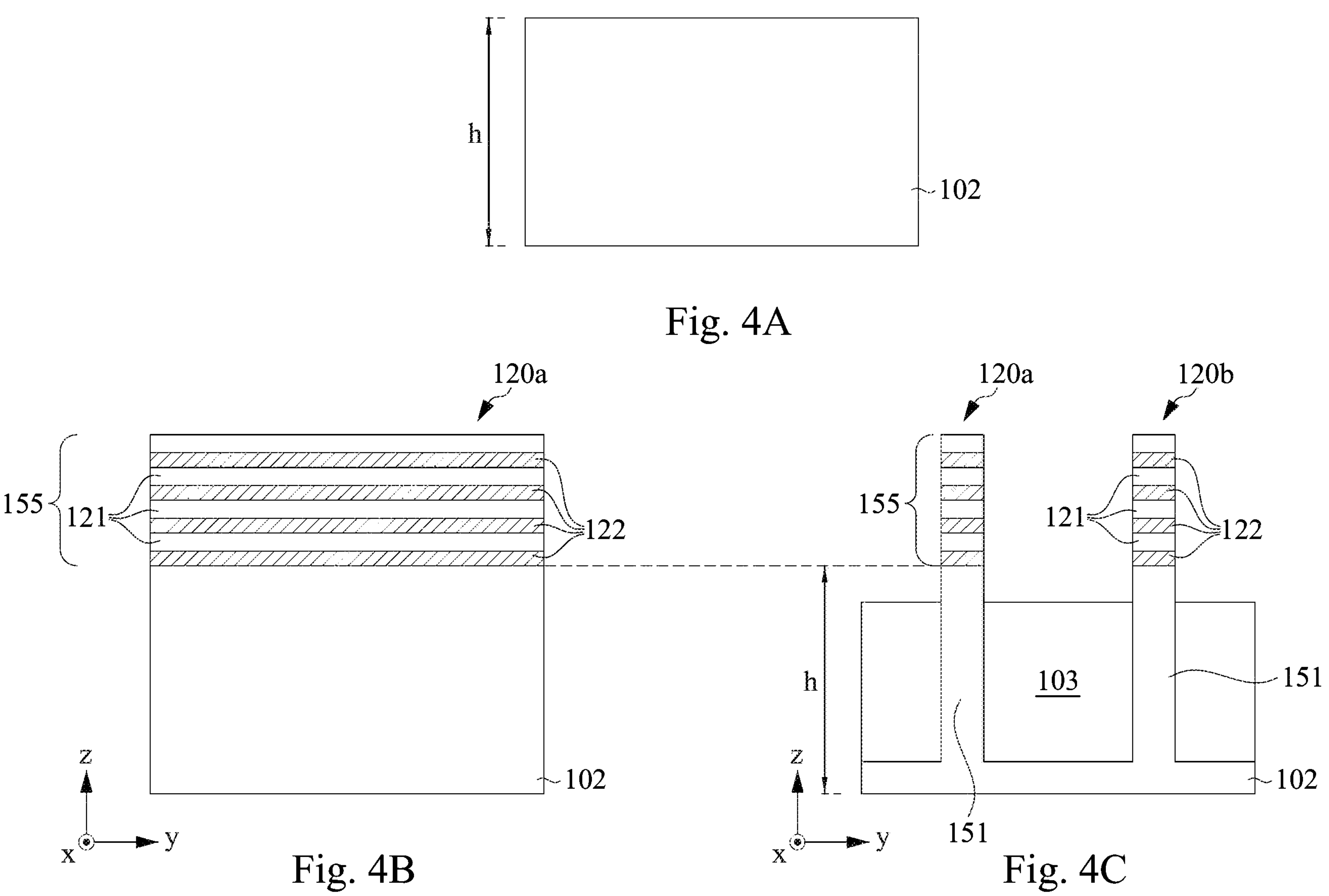

In operation 302, superlattice structures are formed on fin structures, which are formed on a substrate. For example, as shown FIGS. 4A-4C, superlattice 155 is formed on fin structures, e.g., fins 151, on substrate 102. FIG. 4A illustrates a cross-sectional view of semiconductor substrate 102 prior to forming superlattice 155. FIG. 4B illustrates a cross-sectional view of substrate 102 after formation of superlattice 155. FIG. 4C illustrates a cross-sectional view of substrate 102 after superlattice 155 has been patterned to form fins 151 and after formation of STI regions 103.

Referring to FIG. 4A, substrate 102 can be a semiconductor material, such as silicon. In some embodiments, substrate 102 can include a crystalline silicon substrate (e.g., wafer). In some embodiments, substrate 102 can include (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic). In some embodiments, substrate 102 can include a glass substrate. In some embodiments, substrate 102 can include a flexible substrate made of, for example, plastic. In some embodiments, substrate 102 can include a crystalline substrate, where a top surface of substrate 102 can be parallel to the (100), (110), (111), or c-plane (0001) crystal plane. In some embodiments, substrate 102 may be a silicon-on-insulator (SOI) substrate that contains a buried layer, e.g., a buried oxide layer. Substrate 102 has a total height h in the z-direction.

Referring to FIGS. 4B and 4C, superlattice 155 can include a stack of nanostructured layers 121 and 122 arranged in an alternating configuration. In some embodiments, nanostructured layers 121 include materials similar to one another, e.g., epitaxial Si, and doped nanostructured layers 122 include materials similar to one another, e.g., doped epitaxial SiGe. Superlattice 155 can include nanostructured layers 121-122 made of materials, such as Si, SiGe, various alloys of silicon, germanium, and boron (e.g., SiGeB, GeB, and SiGeSnB), silicon arsenide (SiAs), silicon phosphide (SiP), silicon carbide (SiC), silicon carbon phosphide (SiCP), and combinations thereof.

In some embodiments, superlattice 155 is formed by etching a stack of two different semiconductor layers arranged in the alternating configuration. Doped nanostructured layers 122 are sacrificial; that is, they are replaced in subsequent processing, while nanostructured layers 121 remain as part of GAAFETs 120. Although FIGS. 4B-5C show three nanostructured layers 121 and four doped nanostructured layers 122, any number of nanostructured layers can be included in each superlattice structure 155. The alternating configuration of superlattice 155 can be achieved by alternating deposition, or epitaxial growth, of SiGe and Si layers, starting from the top silicon layer of substrate 102. Etching the Si layers can form nanostructured layers 121, which are interleaved with SiGe doped nanostructured layers 122. In some embodiments, each of the nanostructured layers 121-122 may have thicknesses between about 3 nm and about 10 nm. In some embodiments, the topmost nanostructured layers (e.g., Si layers) of superlattice 155 may be thicker than the underlying nanostructured layers. Though rectangular cross-sections of nanostructured channel layers 121 are shown, channel layers 121 and/or doped nanostructured layers 122 can have cross-sections of other geometric shapes (e.g., circular, elliptical, triangular, or polygonal).

Superlattice 155, as a multi-layer stack of two different semiconductor materials, can be formed via an epitaxial growth process. The epitaxial growth process can include (i) chemical vapor deposition (CVD), such as low pressure CVD (LPCVD), rapid thermal chemical vapor deposition (RTCVD), metal-organic chemical vapor deposition (MOCVD), atomic layer CVD (ALCVD), ultrahigh vacuum CVD (UHVCVD), reduced pressure CVD (RPCVD), and other suitable CVD processes; (ii) molecular beam epitaxy (MBE) processes; (iii) other suitable epitaxial processes; or (iv) a combination thereof. In some embodiments, source/drain regions can be grown by an epitaxial deposition/partial etch process, which repeats the epitaxial deposition/partial etch process at least once. Such repeated deposition/partial etch process is also called a "cyclic deposition-etch (CDE) process." In some embodiments, source/drain regions can be grown by selective epitaxial growth (SEG), where an etching gas can be added to promote selective growth on exposed semiconductor surfaces of substrate 102 or the fin, but not on insulating material (e.g., dielectric material of STI regions 103).

Surface-doped GAA structures as disclosed herein can be made using doped nanostructured layers 122 that are formed by introducing dopants in-situ, during the epitaxial growth process as described above. In some embodiments, the dopant concentration in doped nanostructured layers 122 thus formed can be between about $1\times10^{12}$ $cm^{-3}$ and about $1\times10^{20}$ cm $^{3}$. Following the formation of superlattice 155, etching of the silicon substrate 102 can continue, to form fins 151, as shown in FIGS. 4B-4C. In a GAAFET, fins 151 provide structural support for superlattice 155. The trenches around fins 151 are then filled with an insulating material to form STI regions 103, as shown in FIG. 4C. For example, STI regions 103 can be deposited and then etched back to a desired height. Insulating material in STI regions 103 can include, for example, a silicon oxide ($SiO_2$), silicon nitride (SiN), silicon oxynitride (SiON), fluoride-doped silicate glass (FSG), or a low-k dielectric material, and/or other suitable insulating material. In some embodiments, the term "low-k" refers to a low dielectric constant. In the field of semiconductor device structures and manufacturing processes, low-k refers to a dielectric constant that is less than the dielectric constant of $SiO_2$ (e.g., less than 3.9). In some embodiments, STI regions 103 can include a multi-layered structure. In some embodiments, the process of depositing the insulating material can include any deposition method suitable for flowable dielectric materials (e.g., flowable silicon oxide). For example, flowable silicon oxide can be deposited for STI regions 103 using a flowable CVD (FCVD) process. The FCVD process can be followed by a wet anneal process. In some embodiments, the process of depositing the insulating material can include depositing a low-k dielectric material to form a liner. In some embodiments, a liner made of another suitable insulating material can be placed between STI regions 103 and adjacent FETs.

In some embodiments, STI regions 103 may be annealed. Annealing the insulating material of STI regions 103 can include annealing the deposited insulating material in a steam environment at a temperature between about 200° C. and about 700° C. for a time period in a range from about 30 min to about 120 min. The anneal process can be followed by a polishing process that can remove a surface layer of the insulating material. The polishing process can be followed by the etching process to recess the polished insulating material to form STI regions 103. The recessing of the polished insulating material can be performed, for example, by a dry etch process, a wet etch process, or a combination thereof. In some embodiments, the dry etch process for recessing the polished insulating material can include using a plasma dry etch with a gas mixture that can include octafluorocyclobutane ($C_4F_8$), argon (Ar), oxygen ($O_2$), helium (He), fluoroform ($CHF_3$), carbon tetrafluoride ($CF_4$), difluoromethane ($CH_2F_2$), chlorine ($Cl_2$), hydrogen bromide (HBr), or a combination thereof with a pressure between about 1 mTorr and about 5 mTorr. In some embodiments, the wet etch process for recessing the polished insulating material can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process for recessing the polished insulating material can include using an etch process that uses ammonia ($NH_3$) and hydrofluoric (HF) acid as etchants and inert gases, such as Ar, xenon (Xe), He, and a combination thereof. In some embodiments, the flow rate of HF acid and $NH_3$ used in the etch process can each range from about 10 sccm to about 100 sccm (e.g., about 20 sccm, 30 sccm, or 40 sccm). In some embodiments, the etch process can be performed at a pressure ranging from about 5 mTorr to about 100 mTorr (e.g., about 20 mTorr, about 30 mTorr, or about 40 mTorr) and a temperature ranging from about 50° C. to about 120° C.

Figure 5B:
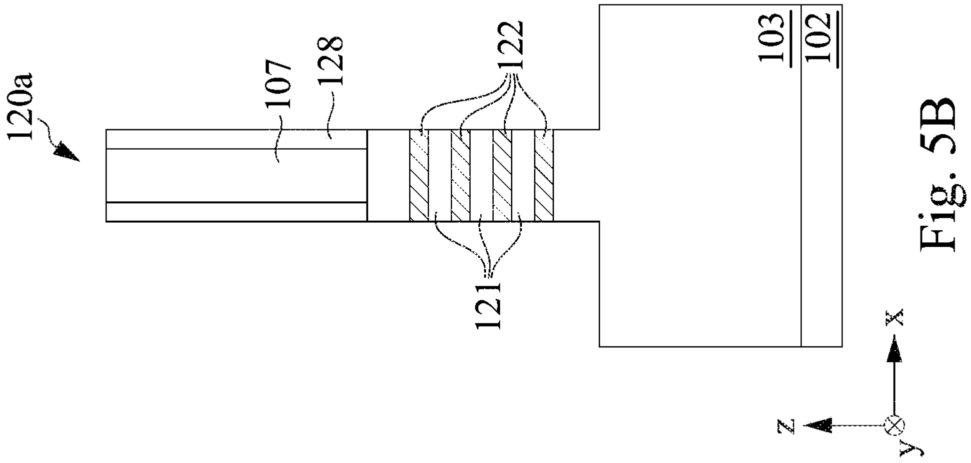
Figure 5A:
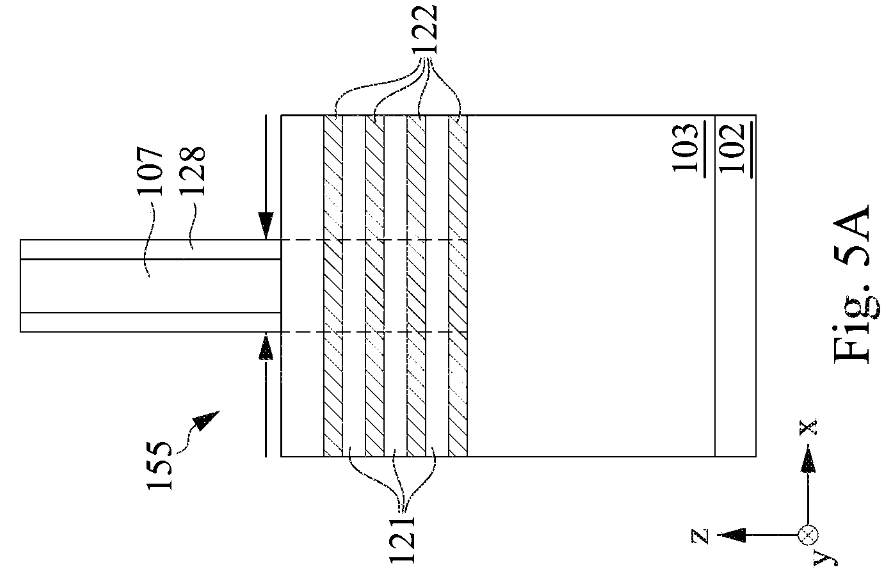

Referring to FIG. 3, in operation 304, a sacrificial structure 107 is formed around superlattice structure 155, as shown in FIGS. 5A-5B. Sacrificial structure 107 includes a polysilicon layer and optionally, one or more sacrificial hard mask layers, omitted for simplicity. Sacrificial structure 107 can also include a sidewall spacer 128. To create sacrificial structure 107, a polysilicon layer can be deposited (e.g., by chemical vapor deposition (CVD) or plasma vapor deposition (PVD)), and then patterned using one or more hard mask layer(s), which can be retained during additional processing, or removed. Hard mask layers can be made of, for example, an oxide material or a silicon nitride (SiN) material that can be grown and/or deposited using an atomic layer deposition (ALD) process. In some embodiments, a hard mask used to pattern the polysilicon layer can be deposited by any suitable method and can be patterned using a photoresist mask. In some embodiments, a vertical (z-direction) dimension of sacrificial structure 107 can be about 90 nm to about 200 nm. Any number of sacrificial structures 107 can be formed substantially parallel to one another. Sidewall spacer 128 can be made of, for example, a silicon nitride (SiN) material that can be grown and/or deposited using an ALD process. In some embodiments, sidewall spacer 128 can include silicon oxide, silicon carbide, silicon oxy-nitride, a low-k material, or combinations thereof. Sacrificial structure 107 is replaced later in the fabrication process, at operation 210, by gate structure 108, which includes metal layers.

Referring to FIG. 3, in operation 306, superlattice structure 155 is removed in the source/drain regions so that nanostructured layers 121 and 122 remain under sacrificial structure 107, as shown in FIG. 5B. Removal of superlattice structure 155 in the source/drain regions can be accomplished using a mask to expose the source/drain regions, followed by an etch-back process using, for example, a diluted HF acid wet etch process. The HF acid can remove both silicon and SiGe nanostructured layers 121 and 122 outside the channel region, while the channel region is protected by hard mask and/or spacer layers of sacrificial structure 107. Such layers, if made of SiN, will not be etched by the HF acid. Alternatively, a dry etch process can be used to remove superlattice structure 155 in the source/drain regions.

Figures 6A, 6B:
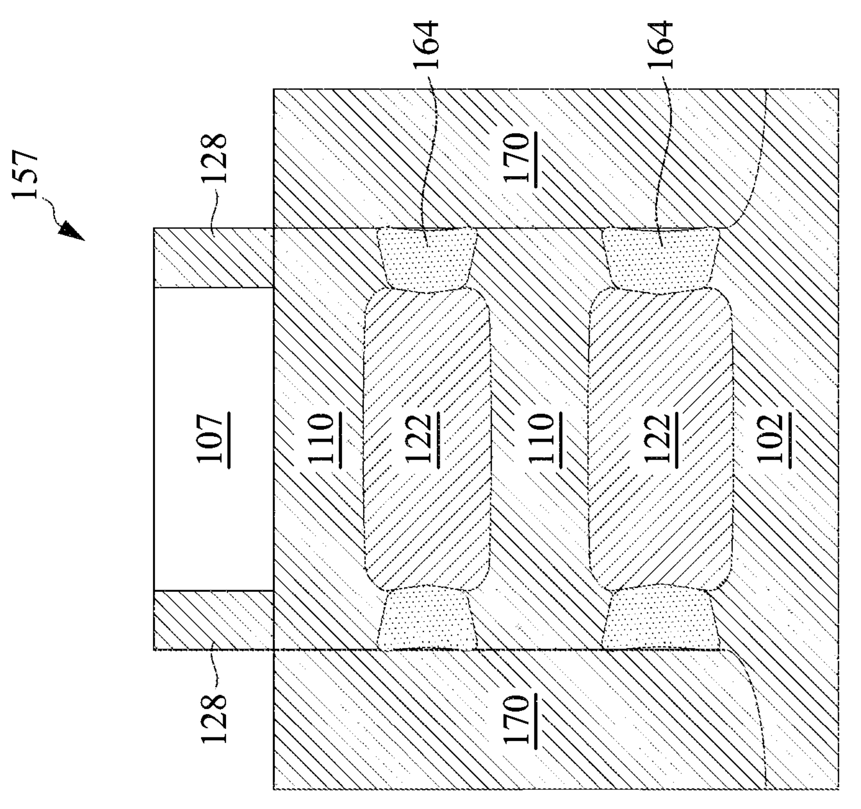

FIG. 6A is a magnified cross-sectional view of superlattice 155 and sacrificial structure 107 shown in FIG. 5A. Superlattice 155 is then etched back, as indicated by arrows shown in FIG. 5A, so that the remaining portion of superlattice 155 is in a GAA channel region 157, underneath sacrificial structure 107, including sidewall spacer 128, as shown in FIGS. 5B and 6B. Referring to FIG. 6B, inner spacers 164 are then formed adjacent to doped nanostructured layers 122 in GAA channel region 157. Next, epitaxial source/drain regions 170 are grown laterally outward, in the x-direction, from nanostructured layers 121.

Figures 7A, 7B, 7C:
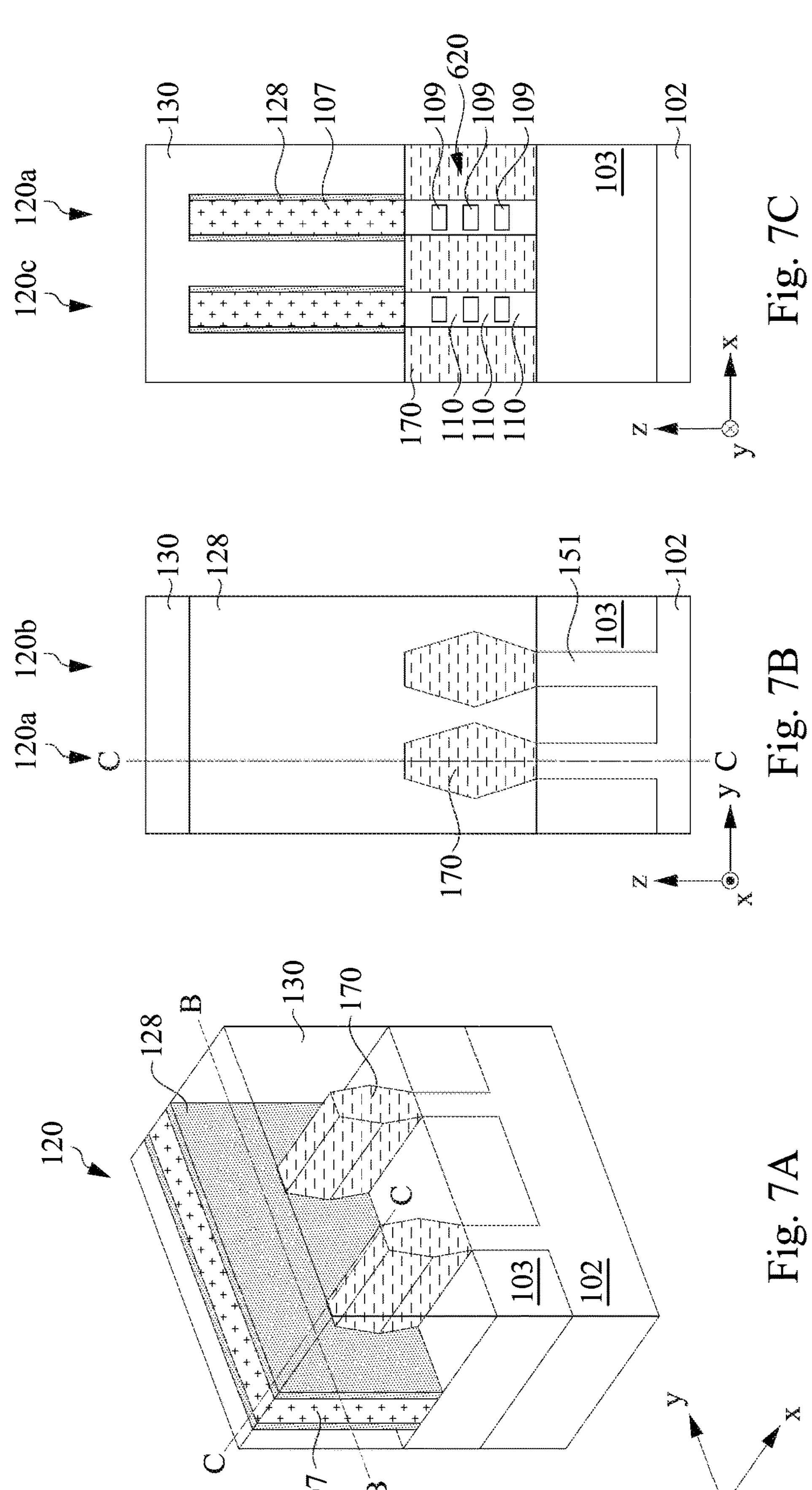

Referring to FIG. 3, in operation 308, epitaxial source/drain regions are formed on either side of sacrificial structure 107, as shown in FIGS. 7A-7C. For example, epitaxial source/drain regions 170 can be grown from nanostructured layers 121 and/or 122 of superlattice 155 under sacrificial structure 107 to form epitaxial source/drain regions 170 having an elongated hexagonal shape, as shown in FIGS. 7A, 7B, and 2B. FIG. 7B is a cross-sectional view along cut line B-B of FIG. 7A. FIG. 7C is a cross-sectional view along cut line C-C of FIG. 7A, across gate structure 108 and through epitaxial source/drain regions 170. Consequently, the cross-sectional view in FIG. 7C shows sidewalls of epitaxial source/drain regions 170, as well as surface-doped GAA channel region 620 between epitaxial source/drain regions 170. Epitaxial source/drain regions 170 can be doped n-type or p-type, depending on channel doping, well doping within substrate 102, and the type of charge carriers intended for the particular device, e.g., an NFET or a PFET device. In the exemplary embodiments, epitaxial source/drain regions 170 are doped with boron. In some embodiments, other p-type dopants can be used, e.g., indium or gallium. In some embodiments n-type dopants (e.g., phosphorous, arsenic, or antimony) can be incorporated into epitaxial source/drain regions 170 for a device of opposite polarity than the examples shown herein. In some embodiments, dopants are incorporated into epitaxial source/drain regions 170 in-situ, during the epitaxial growth process to avoid exposure to a thermal process.

Figure 6D:
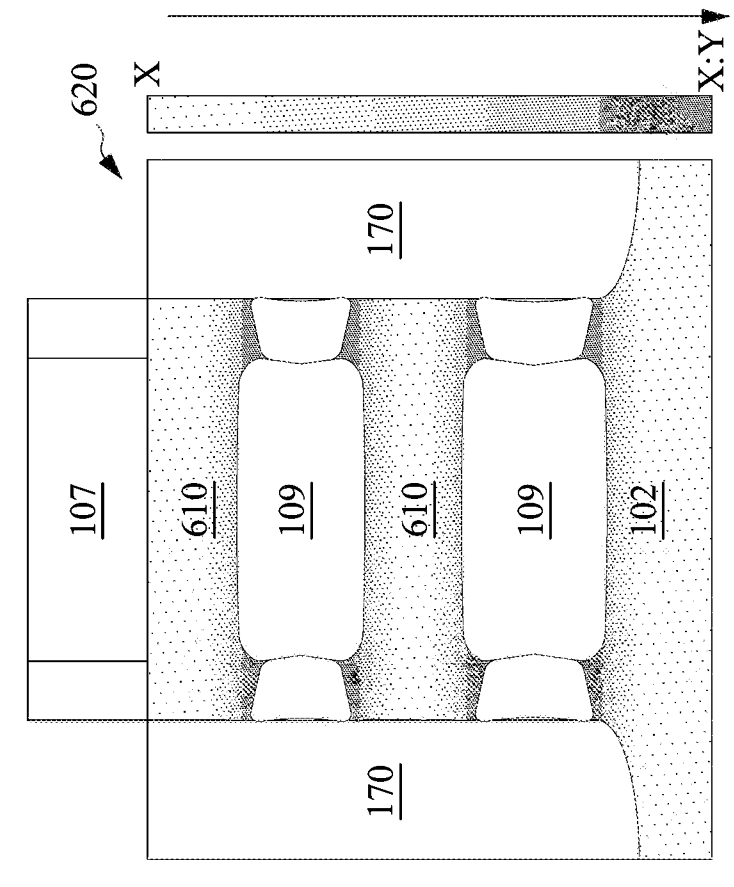
Figure 6C:
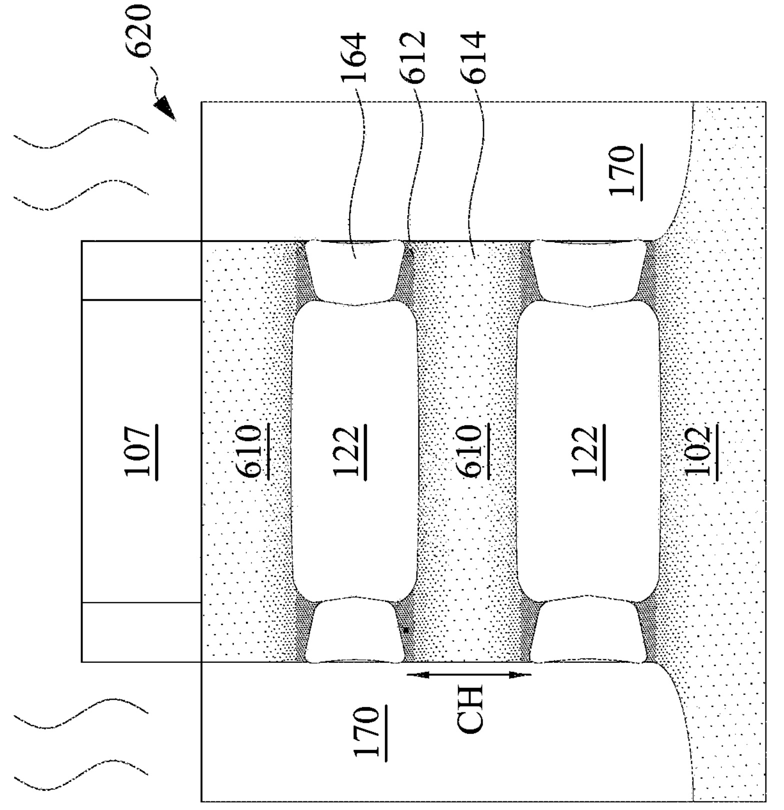

Referring to FIG. 3, in operation 310, an annealing process can be performed, as illustrated in FIG. 6C. The annealing temperature can be in the range of about 600 C to about 1300 C. In some embodiments, the annealing process may have a dual purpose. First, the annealing process may incorporate dopants introduced during epitaxial growth of the source and drain regions. Second, the same annealing process can be used simultaneously to diffuse dopants from surfaces of doped nanostructured layers 122 into adjacent channels 110, as shown in FIG. 6C, to form surface-doped channels 610. By way of example, doped nanostructured layers 122 can be formed initially, as part of superlattice 155, as SiGe layers doped with boron (SiGe:B). During the anneal operation, a high ambient temperature causes boron atoms to diffuse from SiGe doped nanostructured layers 122 into channels 110, thereby establishing a dopant concentration gradient that extends radially inward from each SiGe surface to the mid-section of each channel The diffusion distance can be in the range of about 1 nm to about 10 nm. In some embodiments, channel regions can have a thickness CH in the range of about 5 nm to about 20 nm. In some embodiments, the concentration gradient, or doping profile, can be continuous, from a most dense interface region 612, at the surface of doped nanostructured layers 122, where the dopant concentration is about $1\times10^{15}cm^{-3}$, to the least dense central channel region 614, where the dopant concentration is about $1\times10^{12}cm^{-3}$.

The highest value of dopant concentration, at the upper end of the range, is the doping level of nanostructured layers 122, which serve as the source of channel dopants. Depending on the anneal temperature, the duration of the annealing operation and the mobility of the particular dopant species in the channel material, the concentration gradient may be steeper or more gradual and may extend farther, or less far, into the mid-section of the channel region. A multi-step anneal may be used to further influence dopant profiles within channels 110. The dopant concentration therefore can be tuned by adjusting one or more of following variables: (i) dopant level of doped nanostructured layers 122, (ii) anneal temperature(s), (iii) anneal time(s), and (iv) material selected for channel layers 121. When different material/dopant combinations of surface-doped GAAFETs are fabricated on a common substrate, as described below, the various different nanostructured layers 122 present on substrate 102 will be subjected to the same anneal temperatures and times. If different annealing processes are needed for different embodiments, some embodiments can be grouped together on one substrate and other embodiments can be processed together on a different substrate.

Referring to FIG. 3, in operation 312, doped nanostructured layers 122 can be removed, as illustrated in FIG. 6D. FIG. 6D shows GAA surface-doped channel region 620, following extraction of sacrificial doped nanostructured layers 122 to form gate openings 109, while leaving sidewall spacers 128 in place. In some embodiments, sacrificial doped nanostructured layers 122 can be removed by etching SiGe selective to Si using a wet etch or a vapor etch chemistry that contains one or more of HF acid and ozone. In some embodiments, sacrificial doped nanostructured layers 122 made of SiGe may be removed selective to channel layers 121 made of silicon, using a plasma etch process that includes one or more of $CF_4$, $CH_2F_2$, $N_2$, and $N_2O_2$.

Referring to FIG. 3, in operation 314, inter-layer dielectric (ILD) 130 is deposited, as shown in FIGS. 7A-7C. FIGS. 7A-7C show an isometric view and cross-sectional views, respectively, of a pair of GAAFETs following operation 314. ILD 130 is an insulating layer that electrically insulates neighboring devices and electrical contacts from one another. ILD 130 can be made of a silicon oxide, for example. ILD 130 can be deposited using a CVD or plasma enhanced CVD (PECVD) process, for example. FIG. 7B is a cross-sectional view of a pair of GAAFETs 120 along cut line B-B, through the pair of fins with epitaxial source/drain regions 170. FIG. 7C is a cross-sectional view of a pair of GAAFETs 120 along cut line C-C through the source/drain and gate.

Figure 8B:
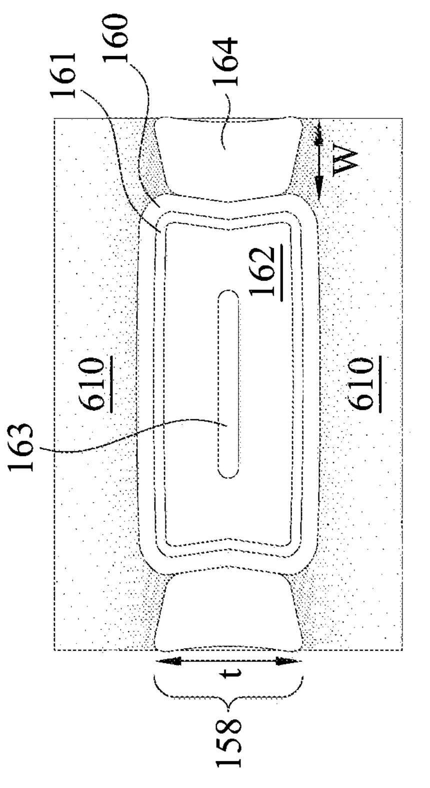
Figure 8A:
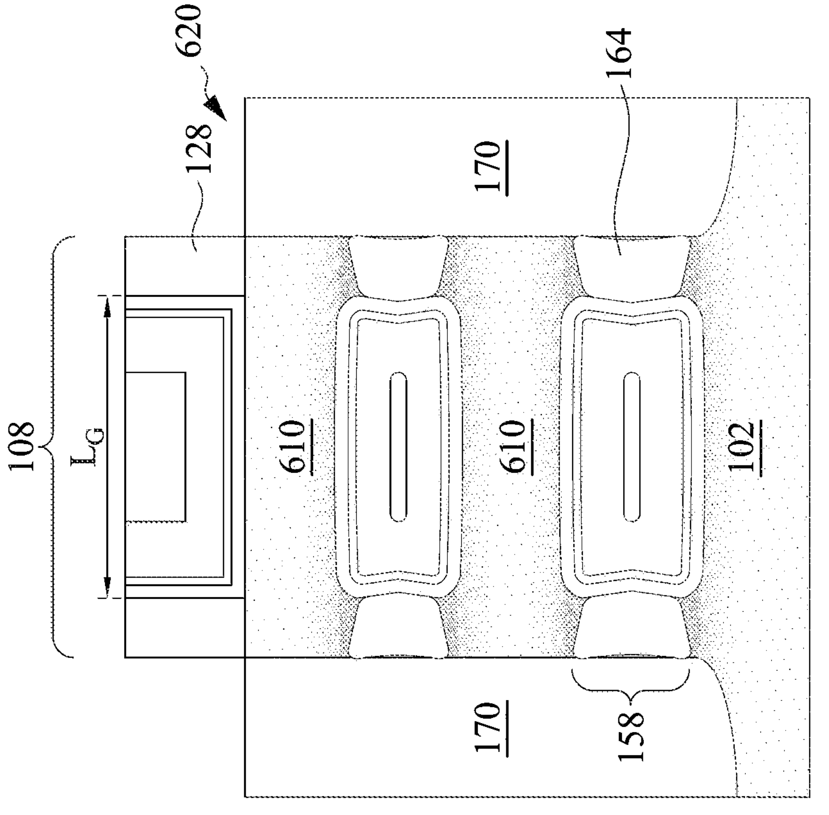

Referring to FIG. 3, in operation 316, following the formation of ILD 130, sacrificial structure 107 is removed and replaced with gate structure 108, as described with respect to FIGS. 8A-8B. FIGS. 8A-8B are magnified views of GAA channel region 620 illustrating operations in a replacement metal gate process, in which gate structure 108 is formed together with GAA structures 158, according to some embodiments.

FIG. 8A is a magnified view of surface-doped channel region 620, following replacement of sacrificial structure 107 with metal gate structure 108. First, sacrificial structure 107, e.g., a poly gate structure, can be removed using a dry etching process (e.g., plasma etching or reactive ion etching (RIE)) or a wet etching process. In some embodiments, gas etchants used in the dry etching process can include chlorine, fluorine, bromine (e.g., hydrogen bromide (HBr), oxygen (e.g., $O_2$ or $O_3$) or combinations thereof. In some embodiments, an ammonium hydroxide ($NH_4OH$), sodium hydroxide (NaOH), and/or potassium hydroxide (KOH) wet etch can be used to remove polysilicon sacrificial structures 107, or a dry etch followed by a wet etch process can be used.

Gate structure 108 is then grown in a multi-operation process to form a metal gate stack in place of sacrificial structure 107. Simultaneously, a radial gate stack is formed to fill gate openings 109 from the outside in, starting with gate dielectric layer 160, and ending with gate electrode 163. Following the replacement metal gate process, GAA surface-doped channel region 620 includes multiple GAA structures 158 (two shown in FIG. 8A), which surround surface-doped channels 610 to control current flow therein. Gate structure 108 has a width equal to the gate length $L_G$ of the GAAFET. In some embodiments, $L_G$ can be in the range of about 5 nm to about 20 nm.

Referring to the magnified view of a single GAA structure 158 shown in FIG. 8B, each GAA structure 158 includes, from the outermost layer to the innermost layer, a bi-layer gate dielectric 160-161, a work function metal layer 162, and a gate electrode 163. Gate electrode 163 is operable to maintain a capacitive applied voltage across surface-doped nanostructured channels 610. Inner spacers 164 electrically isolate GAA structure 158 from epitaxial source/drain region 170 and prevent current from leaking out of surface-doped nanostructured channels 610. In some embodiments, inner spacers 164 can have a width w from about 2 nm to about 8 nm. In some embodiments. GAA structures 158 can have a thickness t from about 3 nm to about 15 nm. The bi-layer gate dielectric 160-161 separates metallic layers of GAA structure 158 from surface-doped nanostructured channels 610. In some embodiments, an ALD process can be used to deposit one or more of radial gate stack layers 160-164.

The bi-layer gate dielectric may include a gate oxide inter-layer 160 and a high-k gate dielectric layer 161. In some embodiments, the bi-layer gate dielectric can have a total thickness between about 1 nm and about 5 nm. Gate oxide inter-layer 160 can include a silicon oxide, silicon nitride, and/or silicon oxynitride material, and may be formed by CVD, ALD, physical vapor deposition (PVD), e-beam evaporation, or other suitable deposition processes. High-k gate dielectric layer 161 includes a high-k material, where the term "high-k" refers to a high dielectric constant that exceeds the dielectric constant of $SiO_2$ (e.g., greater than 3.9). In some embodiments, the high-k dielectric material can be hafnium oxide ($HfO_2$). A high-k gate dielectric may be formed by ALD and/or other deposition methods.

Gate work function metal layer 162 can include a single metal layer or a stack of metal layers. The stack of metal layers can include metals having work functions similar to or different from each other. In some embodiments, gate work function metal layer 162 can include, for example, aluminum (Al), copper (Cu), tungsten (W), titanium (Ti), tantalum (Ta), cobalt (Co), metal nitrides, metal silicides, metal alloys, and/or combinations thereof. In some embodiments, gate work function metal layer 162 can be a bi-layer of titanium nitride (TiN) and a titanium-aluminum (TiAl) alloy. The gate work function metal layer can be formed using a suitable process, such as ALD, CVD, PVD, plating, and combinations thereof. In some embodiments, the gate work function metal layer can have a thickness between about 2 nm and about 15 nm.

Gate electrode 163 may further include a gate metal fill layer. The gate metal fill layer can include a single metal layer or a stack of metal layers. The stack of metal layers can include metals different from each other. In some embodiments, the gate metal fill layer can include one or more suitable conductive materials or alloys, such as Ti, Al, and TiN. The gate metal fill layer can be formed by ALD, PVD, CVD, or other suitable deposition process. Other materials, dimensions, and formation methods for the gate dielectrics 160-161, the gate work function metal layer 162, and the gate electrode 163 are within the scope and spirit of this disclosure.

Figures 9A, 9B, 9C:
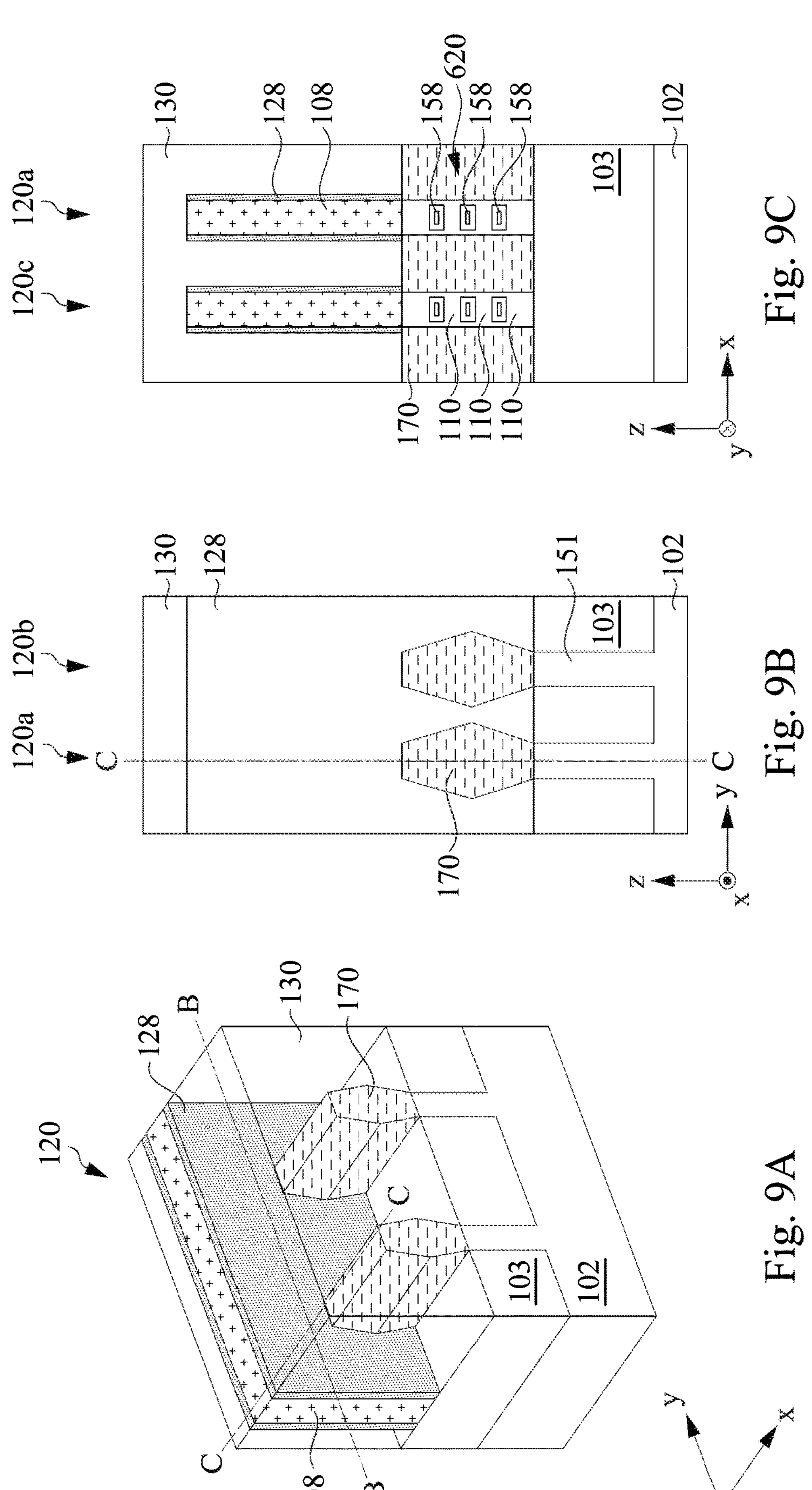

FIGS. 9A-9C show isometric and cross-sectional views of GAAFETS 120 following the replacement metal gate process, wherein sacrificial structures 107 have been replaced by metal gate structures 108, and gate openings 109 have been replaced by GAA structures 158 in surface-doped channel regions 620.

Although, in the above example, nanostructured layers 122 are made of SiGe:B, different materials can be used in other embodiments. Depending on which material is used to form doped nanostructured layers 122, and which dopant is used, a threshold voltage of GAAFET 120 can be tuned to various values, or ranges of values. Example values of threshold voltage, without channel doping, are in the range of about 0.1 V to about 1.2 V. With surface-doped channels 610, the threshold voltage can be tuned by about ±20 mV to about ±50 mV. When a channel dopant species introduced into channels 610 is chosen to have opposite polarity from its neighboring epitaxial source/drain region 170, the species is referred to as an "anti-dopant" and the device is said to be "anti-doped." Anti-doping can be used to increase the threshold voltage above the $v_t$ of a GAAFET that does not have surface-doped channels 610. For example, when epitaxial source/drain region 170 is made of SiGe doped with an n-type dopant, such as phosphorous (SiGe:P), to create an NFET device, while surface-doped channels 610 are made of SiGe:B, the channel and the source/drain regions are "anti-doped." If, on the other hand, the same NFET device has surface-doped channels 610 that are also made of SiGe:P, which also has negative polarity, the species is referred to as a "dopant" and the device is said to be "doped." Same-type doping can be used to decrease the threshold voltage below the $v_t$ of a GAAFET that does not have surface-doped channels 610.

FIG. 10 shows eight different combinations of NFETs and PFETs having different channel dopant species. In the first four examples, both the source/drain and the channel are made of the same material and are doped with the same species. In the last four examples, the materials are the same, but the dopants are impurities of opposite polarity, phosphorous being n-type, and boron being p-type. Thus, the last four examples are "anti-doped."

FIG. 11 illustrates a sequence of patterning operations, according to a first scheme, that allows for the different embodiments shown in FIG. 10 to be fabricated on substrate 102. In this scheme, it is possible to make NFET and PFET devices having a silicon fin (silicon source/drain and channel), as well as NFET and PFET devices having a SiGe fin (SiGe source/drain and channel). In FIG. 11, photoresist masks are used to block deposition of superlattice 155 onto prescribed areas of substrate 102. In the example illustrated in FIG. 11, each mask A-D is used to block three areas, allowing deposition to occur in only one area. In some embodiments, hard masks may be used instead of photoresist masks.

Referring to FIG. 11, in a first operation, a mask A covers three areas of the substrate, restricting formation of a superlattice 155*a* to a first area. In first superlattice 155*a,* channel layers 121 are made of silicon and doped nanostructured layers 122 are made of SiGe:P. In a second operation, mask B is then used to cover the first superlattice 155*a* and two areas of the substrate, while formation of a second superlattice 155*b* is restricted to a second area. In second superlattice 155*b,* channel layers 121 are made of silicon and doped nanostructured layers 122 are made of SiGe:B. In a third operation, mask C is covers first and second superlattices 155*a* and 155*b* that are already formed, as well as one area of the substrate, while a third superlattice 155*c* is formed. In third superlattice 155*c,* channel layers are made of SiGe and doped nanostructured layers 122 are made of Si:P. In a fourth operation, mask D is used to cover all but a final area of the substrate, while formation of a fourth superlattice 155*d* is restricted to a single uncovered (fourth) area. Fourth superlattice 155*d* has channel layers 121 that are made of SiGe and doped nanostructured layers 122 that are made of Si:B.

Figure 12:
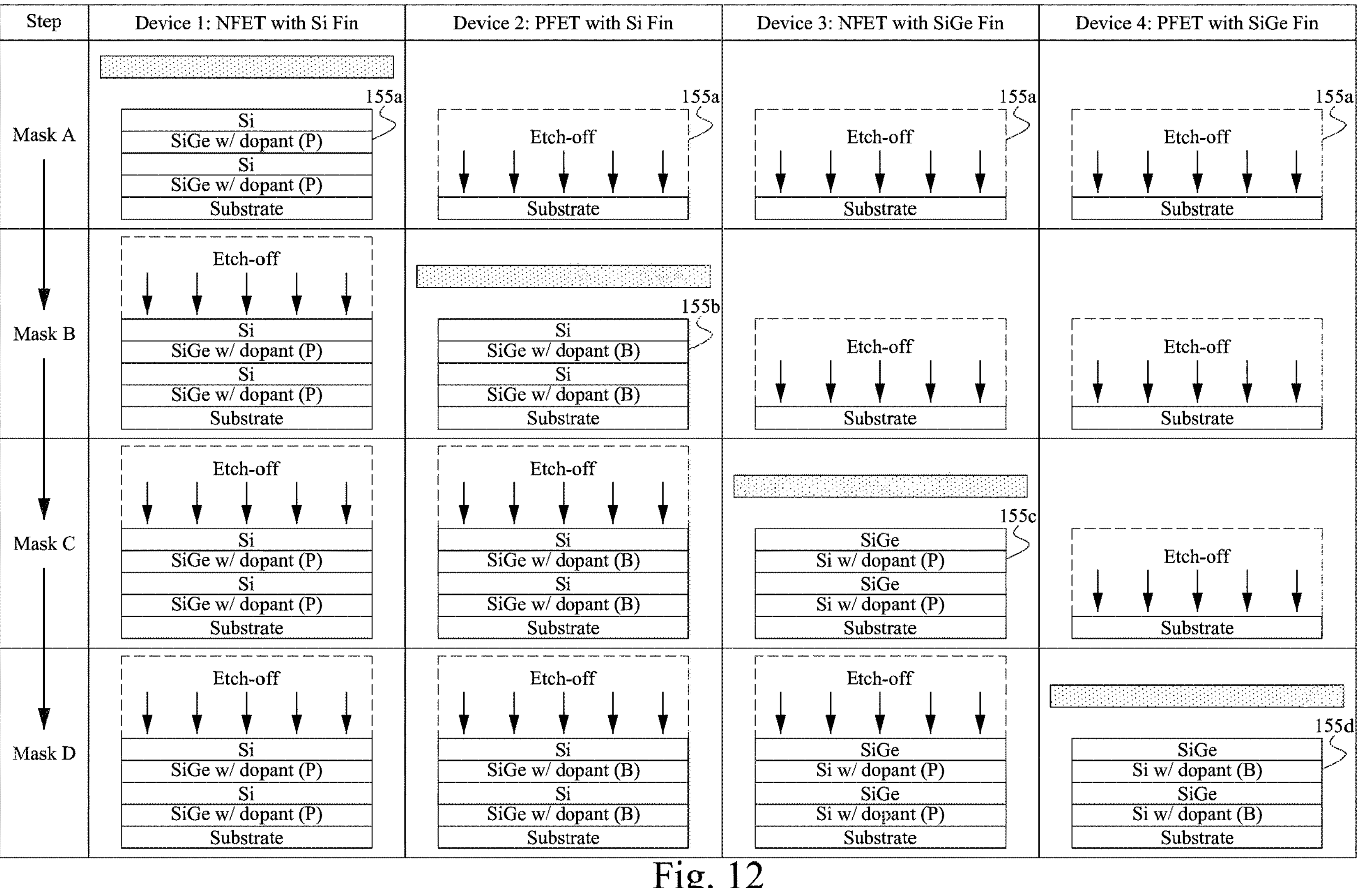

FIG. 12 illustrates an alternative scheme to FIG. 11 for fabricating the different embodiments shown in FIG. 10 on substrate 102. In the second scheme illustrated in FIG. 12, instead of blocking areas of the substrate to restrict where superlattices 155 can be formed, superlattices 155 can be formed anywhere on substrate 102, and then superlattices 155 can be etched away from certain prescribed areas of substrate 102 while remaining in other areas. Dotted lines shown in FIG. 12 indicate where a superlattice 155 was previously formed, either on substrate 102 or on top of another superlattice, and was subsequently etched away using, for example, a timed etch. In some embodiments, a lift-off process involving an intervening layer between the substrate and superlattice 155, or between successive superlattices 155 can be used to remove superlattice(s) 155.

In a first operation, a first superlattice 155*a* can be formed in all regions of substrate 102. First superlattice 155*a* corresponds to an NFET device with Si fin, in which doped nanostructured layers 122 are made of SiGe:P. After deposition of superlattice 155*a,* mask A covers the first area while first superlattice 155*a* is etched away from the other three areas, down to the substrate 102. In a second operation, a second superlattice 155*b* can be formed in all regions of substrate 102. Second superlattice 155*b* corresponds to a PFET device with Si fin, in which doped nanostructured layers 122 are made of SiGe:B. Then mask B covers a second area while second superlattice 155*b* is etched away from the other three areas. In a third operation, a third superlattice 155*c* can be formed in all regions of substrate 102. Third superlattice 155*c* corresponds to an NFET device with SiGe fin, in which doped nanostructured layers 122 are made of Si:P. Then mask C covers a third area while third superlattice 155*c* is etched away from the other three areas. In a fourth operation, a fourth superlattice 155*d* can be formed in all regions of substrate 102. Fourth superlattice 122*d* corresponds to a PFET device with SiGe fin, in which doped nanostructured layers 122 are made of Si:B. Then mask D covers a fourth area while fourth superlattice 155*d* is etched away from the other three areas.

Using either the masking scheme in FIG. 11 or the masking scheme in FIG. 12, threshold voltages of GAAFETs can be mask-defined instead of relying on more invasive process changes (e.g., changes in work function metals) for threshold voltage tuning While the masking scheme of FIG. 11 may be more complicated than that of FIG. 12, less wafer processing is needed.

By introducing dopants or anti-dopants into stacked channels of a GAAFET, the threshold voltage of the device can be raised or lowered as desired, in accordance with circuit design requirements. The annealing operation can be tuned to further control the dopant profile in the stacked channels, either by altering the anneal temperature, the anneal duration, or both. Adjusting the initial doping level of doped nanostructured layers bordering the stacked channels provides another means of fine-tuning the threshold voltage. Such a surface-doping technique avoids altering materials, such as work function layers within the gate stack, to tune the threshold voltage of a GAAFET.

In some embodiments, a method includes: forming a nano-sheet structure on a semiconductor substrate, the nano-sheet structure having channel layers and sacrificial doped layers surrounded by a sacrificial gate structure; annealing the nano-sheet structure to drive dopants from the sacrificial doped layers into the channel layers to form doped channel layers having dopant gradients with a higher concentration adjacent to the sacrificial doped layers than at mid-sections of the channel layers; and replacing the sacrificial doped layers and the sacrificial gate structure with a gate all-around structure.

In some embodiments, a method includes: forming a superlattice on fins on a substrate, the superlattice comprising doped nanostructured layers and channel layers; forming isolation regions on the substrate; forming a sacrificial structure on the superlattice; etching back the superlattice in source/drain regions, while leaving the superlattice in a gate region; forming inner spacers and epitaxial source/drain regions; annealing the superlattice in the channel region to drive in dopants from the doped nano-structured layers into the channel layers; removing the doped nanostructured layers from the annealed channel region; forming an inter-layer dielectric over the epitaxial source/drain regions; and replacing the sacrificial structure with a gate structure.

In some embodiments, a device includes: a substrate; a fin on the substrate; doped source/drain regions at opposite ends of the fin; a gate structure that surrounds the fin; and a plurality of stacked channels within the gate structure, in which each of the plurality of stacked channels has a dopant gradient with a higher concentration adjacent to gate structure than at a mid-section of the stacked channel.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
- forming a superlattice on fins on a substrate, the superlattice comprising doped nanostructured layers and channel layers, wherein the doped nanostructure layers comprise p-type or n-type dopants;
- forming isolation regions on the substrate;
- forming a sacrificial structure on the superlattice;
- etching back the superlattice in source/drain regions, while maintaining the superlattice in a gate region;
- forming inner spacers and epitaxial source/drain regions;
- annealing, the doped nanostructured layers with the inner spacers separating the epitaxial source/drain regions from the doped nanostructured layers to drive in the p-type or n-type dopants from the doped nano-structured layers into the channel layers and form a dopant concentration gradient in each of the channel layers;
- removing the doped nanostructured layers from an annealed channel region;
- forming an inter-layer dielectric over the epitaxial source/drain regions; and
- replacing the sacrificial structure with a gate structure.

2. The method of claim 1, wherein forming the epitaxial source/drain regions comprises growing source/drain regions from channel layers of the superlattice, wherein the source/drain regions and the channel layers are made of a same material.

3. The method of claim 1, wherein forming the epitaxial source/drain regions comprises incorporating dopants in-situ during an epitaxial growth process.

4. The method of claim 1, wherein forming the epitaxial source/drain regions comprises doping the epitaxial source/drain regions with impurities of opposite polarity with respect to the p-type or n-type dopants in the doped nano-structured layers.

5. The method of claim 1, wherein annealing the superlattice comprises forming a graduated dopant profile in the channel layers with a dopant concentration range from about $1\times10^{12}$ $cm^{-3}$ to about $1\times10^{15}$ $cm^{-3}$.

6. The method of claim 1, wherein forming the superlattice comprises using one or more masks to select materials and dopant types for the channel layers.

7. The method of claim 6, wherein using the one or more masks comprises selecting materials and dopant types for the channel layers to form different compositions and doping profiles on the substrate.

8. The method of claim 6, wherein using the one or more masks comprises blocking a first area of the substrate to deposit a superlattice on a second area of the substrate.

9. A method, comprising:
- forming a fin structure on a substrate;
- growing a superlattice on the fin structure, wherein the superlattice comprises first nanostructure layers and second nanostructure layers stacked alternatingly, and wherein the first nanostructure layers comprise first type dopants, wherein the first type dopants comprise p-type or n-type dopants;
- depositing inner spacers on side surfaces of the first nanostructure layers;
- growing epitaxial source/drain regions on side surfaces of the second nanostructure layers;
- forming, by annealing the first and second nanostructure layers with the inner spacers separating the first nanostructure layers and the epitaxial source/drain regions, a dopant concentration gradient in each of the second nanostructure layers;
- removing the first nanostructured layers; and
- forming a gate structure around each of the second nanostructure layers.

10. The method of claim 9, wherein forming the dopant concentration gradient comprises forming the dopant concentration gradient extending radially inward in each of the second nanostructure layers, and wherein the doping concentration decreases from surfaces of each of the second nanostructure layers to central regions of each of the second nanostructure layers.

11. The method of claim 10, wherein forming the dopant concentration gradient comprises:
- controlling the doping concentration at the surfaces of each of the second nanostructure layers to be about $1\times10^{15}$ $cm^{-3}$; and
- controlling the doping concentration at the central regions of each of the second nanostructure layers to be about $1\times10^{12}$ $cm^{-3}$.

12. The method of claim 9, wherein growing the epitaxial source/drain regions comprises doping the epitaxial source/drain regions with second type dopants opposite to the first type dopants.

13. The method of claim 9, wherein forming the dopant concentration gradient comprises annealing the superlattice at a temperature between about 600° C. and about 1300° C.

14. A method, comprising:

forming a multi-layer stack that comprises a first nanostructure layer and a second nanostructure layer in contact with the first nanostructure layer, wherein the first nanostructure layer comprises epitaxial silicon germanium (SiGe) doped with first type dopants;

etching the multi-layer stack to form a fin structure;

forming an epitaxial source/drain region adjacent to the fin structure, wherein forming the epitaxial source/drain region comprises introducing second type dopants in the epitaxial source/drain region;

performing, after introducing the second type dopants in the epitaxial source/drain region, an annealing process to concurrently activate the second type dopants in the epitaxial source/drain region and diffuse the first type dopants from the first nanostructure layer to the second nanostructure layer; and replacing the first nanostructure layer by a gate structure surrounding the second nanostructure layer.

15. The method of claim 14, wherein a concentration gradient of the first type dopants is along a direction perpendicular to a top surface of the multi-layer stack.

16. The method of claim 14, wherein etching the multi-layer stack comprises forming coplanar side surfaces of the first and second nanostructure layers.

17. The method of claim 14, wherein the first type dopants comprise boron, and wherein the second type dopants comprise phosphorous.

18. The method of claim 1, wherein annealing the superlattice comprises doping first and second portions of each of the channel layers, wherein the first and second portions are adjacent to the inner spacers and the doped nanostructure layers, respectively, and wherein a first dopant concentration of the first portion is greater than a second dopant concentration of the second portion.

19. The method of claim 9, further comprising forming a doping profile in each of the second nanostructure layers, wherein the doping profile comprises a first dopant concentration of a first region adjacent to the gate structure less than a second dopant concentration of a second region adjacent to the inner spacers.

20. The method of claim 14, wherein performing the annealing process comprises forming a surface-doped channels in the second nanostructure layer.

* * * * *